US008018766B2

(12) United States Patent
Haines et al.

(10) Patent No.: US 8,018,766 B2
(45) Date of Patent: Sep. 13, 2011

(54) CONCURRENT INTERSYMBOL INTERFERENCE ENCODING IN A SOLID STATE MEMORY

(75) Inventors: Jonathan Williams Haines, Boulder, CO (US); Timothy Richard Feldman, Louisville, CO (US)

(73) Assignee: Seagate Technology LLC, Cupertino, CA (US)

( * ) Notice: Subject to any disclaimer, the term of this patent is extended or adjusted under 35 U.S.C. 154(b) by 137 days.

(21) Appl. No.: 12/474,843

(22) Filed: May 29, 2009

(65) Prior Publication Data

US 2010/0302871 A1 Dec. 2, 2010

(51) Int. Cl.
*G11C 16/04* (2006.01)

(52) U.S. Cl. .......... 365/185.02; 365/185.24; 365/189.16

(58) Field of Classification Search ............. 365/185.02, 365/185.09, 185.24, 185.33, 189.16, 163, 365/218, 185.24 X, 189.16 X
See application file for complete search history.

(56) References Cited

U.S. PATENT DOCUMENTS

| 6,441,786 | B1 * | 8/2002 | Jasper et al. | 342/383 |
| 7,453,723 | B2 * | 11/2008 | Radke | 365/185.02 |
| 7,697,325 | B2 * | 4/2010 | Sprouse et al. | 365/185.03 |
| 7,830,718 | B2 * | 11/2010 | Sarin et al. | 365/185.18 |

OTHER PUBLICATIONS

Giulio G. Marotta et al., "Memory Circuit Technologies" taken from "Nonvolatile Memory Technologies with Emphasis on Flash", 2008; cover, table of contents, pp. 66-75; published by John Wiley & Sons, Inc. Hoboken, New Jersey.
An-Tze Yu and Hsiao-Chuan Wang., "Channel Effect Compensation in LSF Domain" EURASIP Journal on Applied Signal Processing, Revised May 9, 2003, pp. 922-929, vol. 2003, issue 9, Hindawi Publishing Corporation, New York, New York.
Louis Scharf, Microsoft PowerPoint—TensorComm "Interference Cancellation as a Mobile Enhancement to Improve Spectral Efficiency" Apr. 2006, pp. 1-17.

* cited by examiner

*Primary Examiner* — VanThu Nguyen
(74) *Attorney, Agent, or Firm* — Theodore M. Magee; Westman, Champlin & Kelly, P.A.

(57) ABSTRACT

Methods and devices are provided for concurrent intersymbol interference encoding in a solid state memory. In an illustrative embodiment, a write data signal is received as input to a processing component. A channel-effect-corrected encoding of the write data signal is produced, where the channel-effect-corrected encoding is based on the write data signal and a channel effect factor that models concurrent intersymbol interference of the write data signal in a target data storage component in communicative connection with the processing component. An output signal based on the channel-effect-corrected encoding of the write data signal is produced from the processing component.

20 Claims, 5 Drawing Sheets

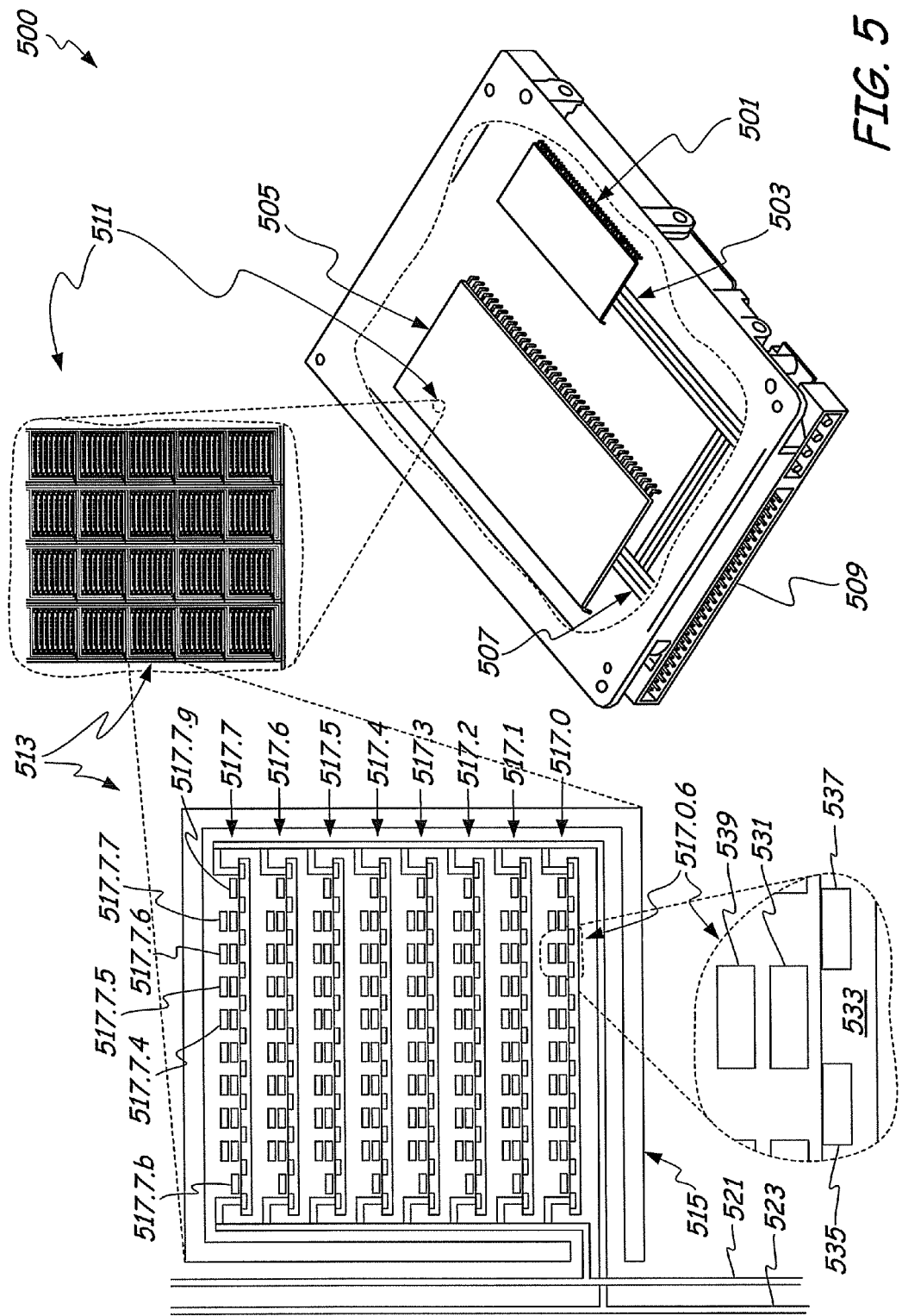

CONCURRENT INTERSYMBOL INTERFERENCE ENCODING IN A SOLID STATE MEMORY

BACKGROUND

Achieving increasingly greater data storage density in data storage media has been a persistent technological goal, and has posed persistent challenges.

SUMMARY

Methods and devices are provided for concurrent intersymbol interference encoding in a solid state memory. In an illustrative embodiment, a write data signal is received as input to a processing component. A channel-effect-corrected encoding of the write data signal is produced, where the channel-effect-corrected encoding is based on the write data signal and a channel effect factor that models concurrent intersymbol interference of the write data signal in a target data storage component in communicative connection with the processing component. An output signal based on the channel-effect-corrected encoding of the write data signal is produced from the processing component.

The features described above are illustrative only and do not define limitations on various embodiments. Other features and benefits that characterize various embodiments will be apparent from the following detailed description, the associated drawings, and the other disclosure herein.

BRIEF DESCRIPTION OF THE DRAWINGS

FIG. 5 depicts a data storage device in accordance with an illustrative embodiment.

DETAILED DESCRIPTION

Figure 1:
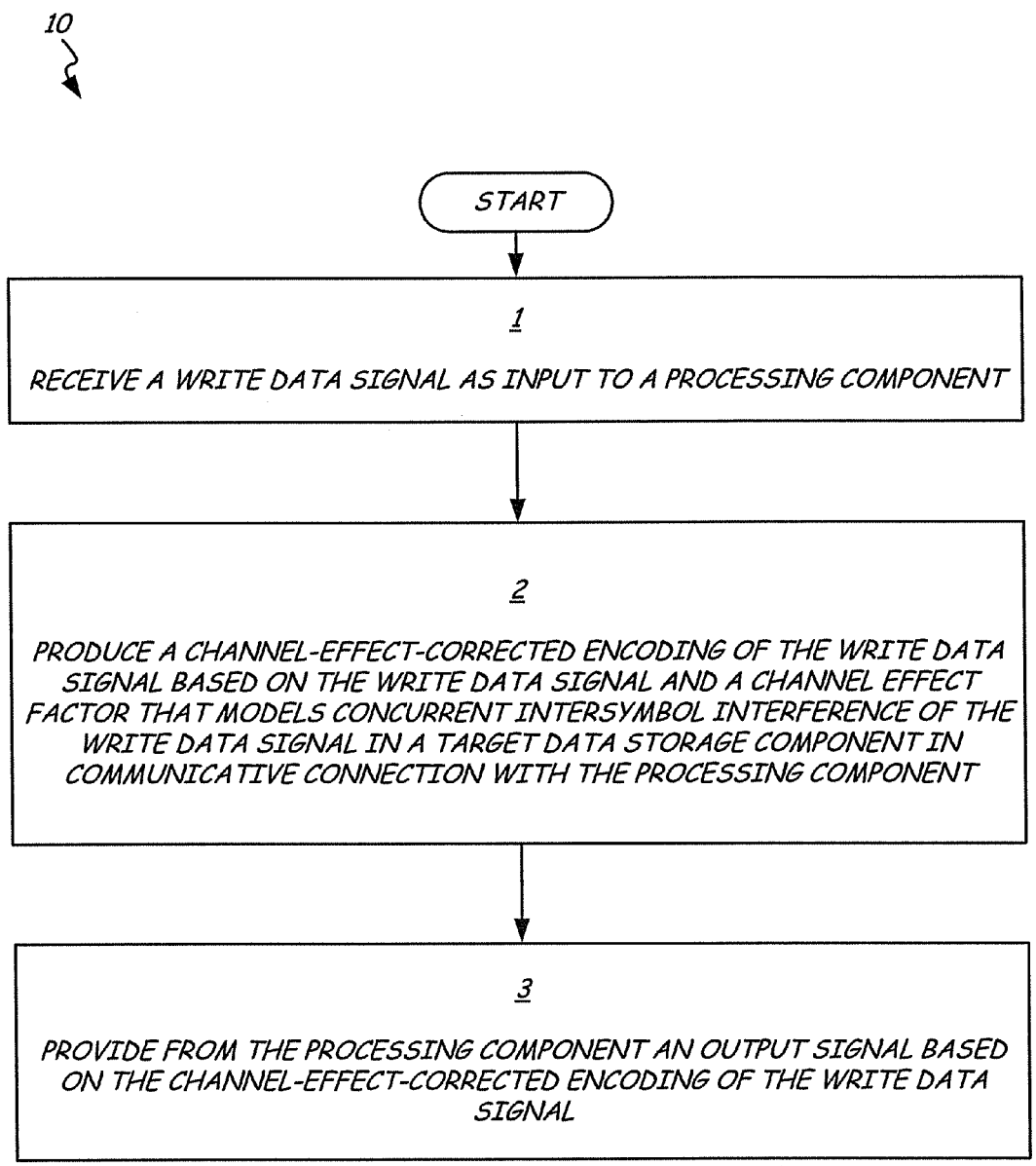
FIG. 1 depicts a flowchart for a method in accordance with an illustrative embodiment.
Figure 2:
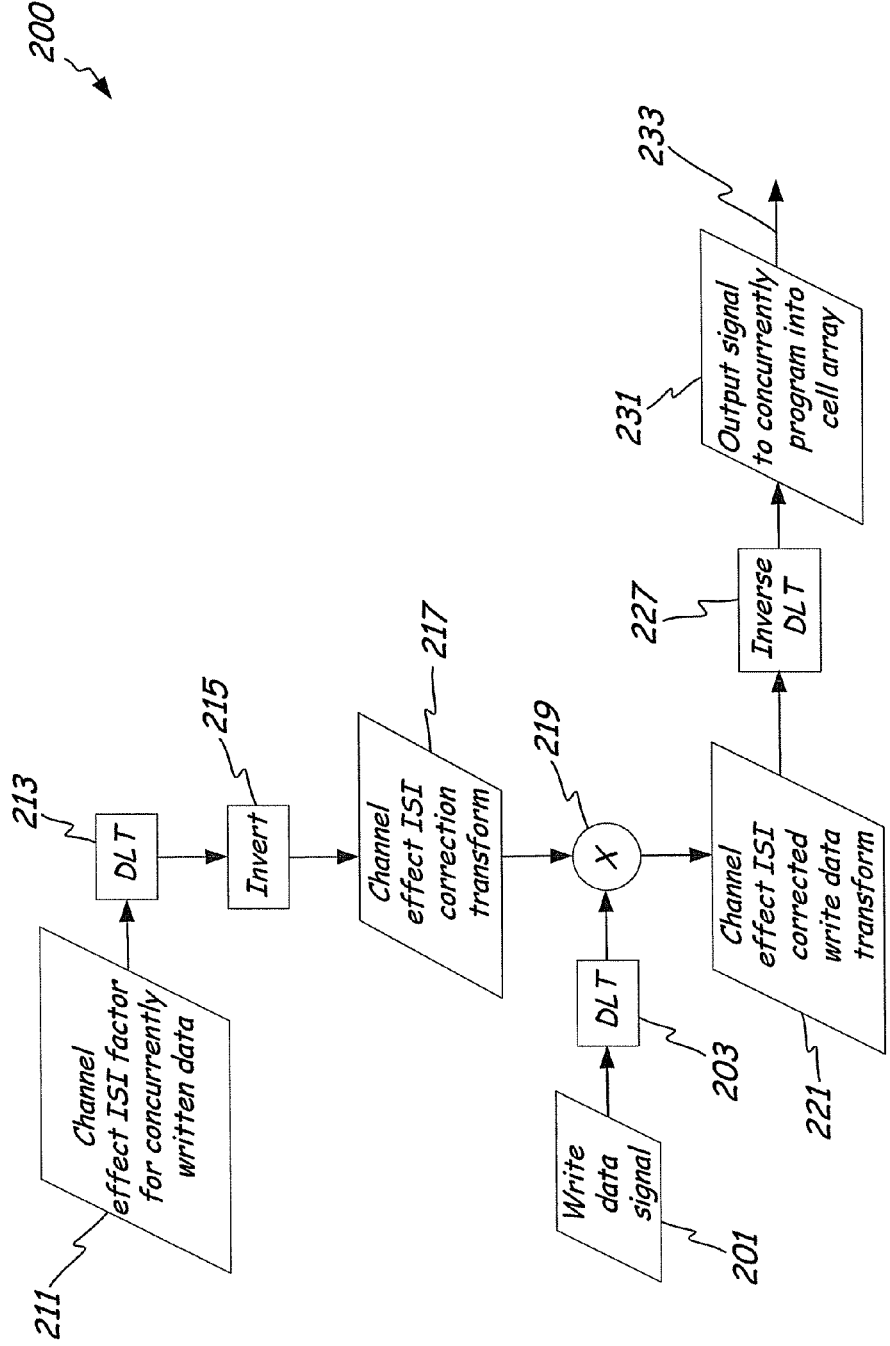
FIG. 2 depicts a block diagram for a method in accordance with an illustrative embodiment.

As an illustrative embodiment, FIG. 1 depicts a flowchart of a method 10 for concurrent intersymbol interference (ISI) encoding in a solid state memory, such as a non-volatile solid state data storage device, for example. FIG. 2 depicts a block diagram of a method 200 for concurrent intersymbol interference encoding in a solid state memory, according to an illustrative embodiment with several aspects of correspondence with method 10 of FIG. 1, while a range of variation is encompassed within the wording and other particulars indicated by these two depicted embodiments. Additional specific details about how method 10 may operate in accordance with one illustrative embodiment may be apprehended in the context of method 200 of FIG. 2 as well as in other contexts involving additional embodiments and features depicted in and described in connection with the subsequent figures.

An exemplary part of the present disclosure relates to producing a concurrent channel effect ISI correction signal, which can be used to effectively counteract channel effect concurrent intersymbol interference that takes place among the data storage cells. The data storage cells may be comprised in a solid state memory, such as a solid state drive, or any other device or component comprising solid state data storage cells. In an illustrative embodiment, "channel effect" indicates concurrent intersymbol interference, and refers to the interference between symbols, bits, or other data elements in the write data signal during a write operation in which a plurality of data symbols are concurrently written to adjacent data storage cells in a programming page or other collection of data storage cells in a data storage component. Whereas the original write signal, if written directly to the data storage array in its original form, may be degraded by concurrent channel effect intersymbol interference, the channel effect correction applied by an exemplary method of this disclosure to the write data signal pre-emptively counteracts that channel effect degradation, such that the physical signal that actually ends up written to the target data storage cells matches the digital logic signal encoded in the original write data signal.

Because intersymbol interference becomes ever more significant relative to signal strength and bit encoding states as feature sizes of a data storage technology grow smaller and denser, effective intersymbol interference correction encoding as provided herein enable substantial advances in data storage density. In an illustrative flash memory embodiment, the methods disclosed herein for concurrent intersymbol interference encoding may also, for example, eliminate the need for an additional step of biasing or forced-erasing unwritten memory cells subsequent to a write operation, which may also substantially reduce or eliminate the need for an on-chip charge pump or for wear leveling in the data storage device, and also substantially extending the number of reliable write cycles and the useful lifetime of the data storage device.

For example, method 10 of FIG. 1 may include step 1, of receiving a write data signal as input to a processing component. In the illustrative embodiment of FIG. 2 this may correspond to the write data signal 201. The write data signal 201 may be considered only as a small portion of data sized for a single programming page or single erasure block of a solid state data storage device, or may be a much larger data signal to write to several erasure blocks up to a large portion or the entirety of a data storage array or data storage component, and/or a large signal of which only a portion is selected for writing to a particular data storage component, in different embodiments, for example. The processing component may illustratively take the form of any or all of an integrated circuit, a portion of an integrated circuit, a portion of a drive, a separate device within a computing device or network, and/or other forms in various embodiments. The processing component may illustratively be comprised within a housing together with data storage cells being written to, and/or may be communicatively connected within a computing device or other device with data storage cells being written to, or may otherwise have communicative access to data storage cells being written to. As an example, the processing component may illustratively take the form of a programming controller in a flash drive, in one illustrative embodiment.

Method 10 may also include step 2, of producing a channel-effect-corrected encoding of the write data signal based on the write data signal and a channel effect factor that models concurrent intersymbol interference of the write data signal in a target data storage component in communicative connection with the processing component. The target data storage component may, for example, include a programming page or other topologically one-dimensional line of data storage cells, or any other portion or entirety of a data storage array or data storage component based on any of various data storage technologies. A line of data storage cells may be considered topologically one-dimensional if it is either spatially one-dimensional, or is otherwise ordered in a sequence in which each cell is communicatively connected and/or physically adjacent to two other cells, one on each side of it in the sequence. An individual data symbol may have a one-to-one correspondence to one bit of data, or may comprise more than one bit of data, in different embodiments. The channel effect factor provided in step 2 of FIG. 1 may illustratively correspond to channel effect factor 211 in the embodiment of FIG. 2, for example.

Channel effect factor 211 may illustratively be used for performing a calculation of what the channel effect intersymbol interference is anticipated to be for the write data signal in one or more target programming pages, in accordance with mathematical models of the physical interactions of the particular write data signal portion with the particular programming page and/or particular data storage cells within that programming page to which the write operation for that write data signal portion is assigned, as an illustrative example. Channel effect factor 211 may illustratively be provided by accessing a model of channel effect intersymbol interference for the write data signal in one or more target programming pages, from an associated data store or computing resource, in an illustrative embodiment.

With a channel effect factor that accurately and reliably indicates, before the fact, the channel effect concurrent intersymbol interference that would otherwise occur if the original write data signal were written directly to the data storage array, an encoding of this channel effect factor may then be inverted, to provide a signal component that is equal and opposite to the predicted channel effect. By imposing this channel effect correction factor onto the write data signal, a channel-effect-corrected write data signal is produced, such that when the channel-effect-corrected write data signal is written to the data storage array, the channel effect correction component of the corrected write data signal cancels out the channel effect intersymbol interference of the concurrently written data, such that the original write signal is the end result of the write operation in the target programming pages, as opposed to an intersymbol-interference-degraded version of the original write signal.

The channel effect correction factor used in step 2 of FIG. 1 may illustratively correspond to channel effect correction factor 217 in the embodiment of FIG. 2, for example, while the operation of imposing a channel effect correction factor onto the write data signal may correspond to element-by-element multiplication operation 219 in FIG. 2, and the channel-effect-corrected encoding of the write data signal provided by step 2 may correspond to channel-effect-corrected write data transform 221, and to the resulting output signal 231 produced by taking the inverse discrete linear transform 227 on the channel-effect-corrected write data transform 221, in the illustrative embodiment of FIG. 2.

In particular, as shown in the illustrative embodiment of FIG. 2, channel effect factor 211 may first be operated on to take a discrete linear transform 213 of the channel effect factor 211. The discrete linear transform 213 may be calculated using a fast Fourier transform, for example, as a computationally efficient method for taking a discrete linear transform. The discrete linear transform 213 of the channel effect may then be inverted in inversion operation 215, such that a convolution factor that is equal and opposite to the predicted channel effect intersymbol interference is encoded, and provided as channel effect correction transform 217. A discrete linear transform may also be performed on the original write data signal 201 in discrete linear transform operation 203. This discrete linear transform may also be computed using a fast Fourier transform, for example, while various other types of discrete linear transforms may also be used, for both discrete linear transform 203 and discrete linear transform 213.

The channel effect correction transform 217 and the discrete linear transform 203 of the original write data signal 201 may then be combined in a multiplication operation 219, in this illustrative embodiment. The result of this multiplication operation is provided as channel-effect-corrected write data transform 221, which encodes (as a linear transform, for example) the write data signal with a superimposed correction factor that preemptively cancels out the upcoming effects of channel effect intersymbol interference when the corrected write signal is then concurrently written to the data storage medium.

Method 10 may therefore also include step 3, of providing, from the processing component that manages data write operations to the data storage array and that applies the channel effect correction factor to the original write data signals, an output signal based on the channel-effect-corrected encoding of the write data signal, in this illustrative embodiment. This output signal comprising the channel-effect-corrected write data signal may correspond to output signal 231 that is provided as an output 233 of the embodiment of FIG. 2, and may be sent over a bus or other signal channel to be applied to a target set of data storage cells of the data storage array to concurrently write the data in a way that negates the data degradation due to channel effects, in the present illustrative embodiment. That target set of data storage cells may be on-chip with the processor, or local within the same device or computer with the processor, or local within a server group or intranet, or in a communicatively connected remote device, or at any location that is at least intermittently communicatively accessible to the ISI correction processor, over a network or other connection, in various embodiments.

As used variously herein, a "signal" may refer either to an original signal, or to a discrete linear transform of that signal that provides an alternative encoding of that signal for computational purposes, or an inverted form of an original discrete linear transform of that signal, or an inverse discrete linear transform of a result of operations on discrete linear transforms, other operation that encodes the original signal or some signal based on one or more of the original signals according to various encoding schemes and/or computational results, and/or other variant of the original signal, for example.

The channel effect intersymbol interference for the concurrently written data may illustratively include peripheral physical influences, on a particular data storage cell, of the concurrently applied write signals intended for other, nearby cells, or more generally on the nearby environment of the data storage array, that do not correspond to the digital logic in the original write signal intended to be encoded in that particular data storage cell. For example, the data storage protocol for the data storage array may have a certain first voltage range that is assigned a value of 0 and a certain second voltage range that is assigned a value of 1, and may also have an intermediate voltage range between the two that should not properly be occupied by any data storage cell, and that has a non-trivial chance of being read indeterminately and of introducing a signal error during a read operation. Yet, in an illustrative example in which a particular data storage cell in a programming page is written to a value of 0 while several of the surrounding data storage cells adjacent to it on both sides are written to values of 1, the combined concurrent intersymbol interference of the many 1 values concurrently written to the data storage cells surrounding the particular data storage cell may add together to partially counteract and degrade the 0 value written to the particular data storage cell, potentially attenuating the intended 0 value up into the high periphery of its intended voltage range, or outside of the proper voltage range for a 0 altogether and into the error-generating intermediate voltage range, or all the way up into the 1 voltage range. Intersymbol interference may therefore pose a source of random and uncontrolled error introduction unless an intersymbol interference correction is applied such as in the illustrative embodiments disclosed herein.

This channel effect intersymbol interference may have a linear interference response, or approximately linear interference response, to write signals by the data storage cells, depending on the particular characteristics of data storage technology used in a variety of embodiments. That is, for purposes of this disclosure, in a linear interference response, write signals applied to the data storage cells may exert a residual and nominally unwanted influence on their neighboring data storage cells, so that bits or symbols of data written to one cell may leak a residual signal that drives partial changes of state in neighboring cells, but in a way that is linearly additive, or approximately so, so that the residual influences do not exhibit hysteresis and are otherwise not a function of the sequential order of neighboring signals over time. Data storage technologies featuring a linear interference response, or approximately linear interference response, may include NAND gate flash memory, other types of flash memory, or phase change memory, for example.

Such channel effect concurrent intersymbol interference may particularly affect specific data storage cells at the ends of a programming page or in a programming page along the edge of an erasure block, in an illustrative embodiment, with these environmental factors exerting a particular attenuation of the intended write signal for these data storage cells in comparison with other data storage cells in the interior of the programming page or erasure block, such that the voltage for either an intended 0 and/or 1 write signal may be particularly attenuated, altering the physical signal away from the intended logic signal encoded by the original write signal toward the error-generating, improper intermediate voltage range. The organization of data storage cells in programming pages and erasure blocks in an illustrative embodiment is further described below with reference to FIG. 5.

In method 200 of FIG. 2, the write data signal 201 may illustratively be encoded in a form corresponding to either a 1*N vector, or an M*N (i.e. M by N or M times N) matrix, in different embodiments, or may illustratively also be a 1*N row taken from a larger M*N matrix signal, among other options. In various embodiments, N may be an integer and the 1*N cells' worth of data may be a quantity of data that will fit in a topologically one-dimensional 1 by N programming page in a data storage component; or M and N may be integers and the M*N cells' worth of data may be a quantity of data that will fit in a two-dimensional M by N array of data storage cells in a data storage array or block, which may be a portion of a larger data storage array, data storage device, or other arrangement of data storage, for example. In yet another illustrative embodiment, a three-dimensional volume of data storage cells may be written to at the same time, and concurrent intersymbol interference correction may be done for three dimensions at a time. In this case, the write data signal may illustratively be encoded in a form corresponding to a tensor or matrix $G_{\mu\nu\rho}$, in which a block of $\mu*\nu*\rho$ cells are written to at the same time, and a $\mu*\nu*\rho$ concurrent ISI correction factor is applied to the write signal.

The channel effect intersymbol interference may illustratively be provided as a function $h(x)$ of one-dimensional intersymbol interference of each data storage cell in a 1*N one-dimensional row of concurrently written cells on each of the other cells in the row, for example; or as a function $h(x,y)$ of two-dimensional intersymbol interference of each data storage cell in an M*N two-dimensional array of concurrently written cells on each of the other cells in the array, in another illustrative example; or as a function $h(x,y,z)$ of three-dimensional intersymbol interference of each data storage cell in a $\mu*\nu*\rho$ three-dimensional volume of concurrently written cells on each of the other cells in the row, in yet another illustrative example. The calculation or representation of concurrent intersymbol interference from each cell on each concurrently written cell may take into account any factors, models, or details of the relative positions of the cells, the structures of the cells, the intervening materials and/or surrounding environmental features of the cells, additional electrical or magnetic factors or environmental influences relevant for concurrent intersymbol interference among the cells, or any other relevant factors.

As an example, in an illustrative embodiment, the initial calculation or other model of the concurrent-ISI-corrected write signal may include components that exceed the write capacity of the write signal that may be applied to the data storage cells, or that exceed the capacity of the data storage cell to respond to the write signal with a data storage response. For example, in a flash memory data storage device, the concurrent-ISI-corrected write signal may include components at a higher voltage than the system's nominal maximum voltage for the write signal, or at a higher charge than the nominal maximum charge that can be stored reliably on one of the data storage cells. This may for example occur when the concurrent ISI correction factor for a given data storage cell is computed to be large compared with the original write signal and outside the normal range of the write signal, such as when it is anticipated to have to try to compensate for strong array edge effects or for a large majority of surrounding data storage cells having opposite components in the write signal. In this case, various additional correction factors may also be applied, such as a vector of gain factors in an automatic gain control system, thereby incorporating a gain control component to compensate for write signal response constraints to the ISI correction in the data storage cells.

In different embodiments, a "data storage component" or a "data storage array" may be taken to mean any set or group of data storage elements of any kind, and is not restricted to any particular terminology or reference to any particular subset of data storage technologies or kinds of data storage elements. The programming page or pages and/or erasure block or blocks used in method 200 may be in any of a wide variety of data storage technologies, illustratively including flash memory, phase-change memory, or other types. The programming page or pages and/or erasure block or blocks may also include data storage cells with either single-state or multiple-state data storage per cell, and may be used to store one bit per cell, more than one bit per cell, or more than one cell per bit in the case of applications in which extraordinary error prevention and/or protecting against potentially harsh electromagnetic conditions are desired.

A state change behavior may exhibit relatively minor and/or theoretically tractable perturbations from a linear interference response, or may be approximately modeled as a linear interference response, potentially including by applying feasible correction factors to address any non-linear interference component. Any data storage technology may be considered to have an approximately linear intersymbol interference response if deviations from linearity at low levels of intersymbol interference are small compared with the tolerances of the system, and/or if a feasible encoding scheme can apply corrections to non-linearity to counteract minor non-linear deviations from a linear interference response, and thereby achieve similar performance, within nominally accepted tolerances in the industry, in intersymbol interference correction as if the data storage interference response was simply linear, for example.

Additionally, while some embodiments may be applied to data storage systems having a linear interference response or only negligible departures from a linear interference response, other embodiments may include data storage array technology or environments in which non-trivial but not extreme perturbations from linearity in the impulse response of the data storage cells. These embodiments may also include one or more steps taken to correct for non-linear effects or approximately model non-linear effects as a linear system prior to taking the discrete linear transforms of the write signal, the concurrently written data, or the channel effect ISI behavior of the concurrently written data, using any of a variety of approximation, correction, or perturbative techniques to correct for perturbations away from linearity in the impulse response of the intersymbol interference behavior of the data. Any system in which such linear approximation is possible may also be considered within the scope of approximately linear intersymbol interference systems to which various embodiments may be applied.

With the channel effect posing an at least approximately linear interference response effect on the write data signal, the influence of the channel effect on the write data signal can be modeled and counteracted using discrete linear transforms of the write data signal and the channel effect factor, to facilitate computational manipulation, prior to taking the inverse transform of the result of the calculations back into a format or protocol corresponding to that of the original write signal. As an illustrative example, method 200 may make use of discrete linear transforms such as fast Fourier transforms of the write data signal and the channel effect factor, as described above, to facilitate calculation of the resulting channel-effect-corrected write data signal 231.

In particular, as indicated above in reference to the illustrative example of FIG. 2, write data signal 201 and the predicted channel effect 211 may be subjected to discrete linear transforms 203 and 213, the discrete linear transform 213 of the channel effect may then be inverted to produce channel effect correction factor transform 217, and then the transforms encoding the write signal and the correction factor may be feasibly manipulated, such as in multiplication operation 219 in the embodiment of FIG. 2, to produce the resulting channel-effect-corrected write data transform 221. An inverse linear transform of channel-effect-corrected write data transform 221 may then be performed, at inverse discrete linear transform operation 227 (illustratively such as an inverse fast Fourier transform), to provide a resulting channel-effect-corrected write signal. These linear transform manipulations, including the linear transformations, the operations on the linear transforms, and the reverse linear transform, will validly maintain the original signals because they correspond to an at least approximately linear intersymbol interference response system.

While any of the discrete linear transforms referred to herein may be computed as a fast Fourier transform (FFT, as indicated in FIG. 2), as an illustrative example, and providing the inverse linear transform may comprise calculating an inverse fast Fourier transform, various embodiments are not limited to the illustrative example of using fast Fourier transforms to calculate the discrete linear transforms. Any other technique or algorithm for determining or approximating the discrete linear transforms, performing operations on the transforms, and determining or approximating inverse discrete linear transforms, may also be used in different embodiments.

Figure 3:
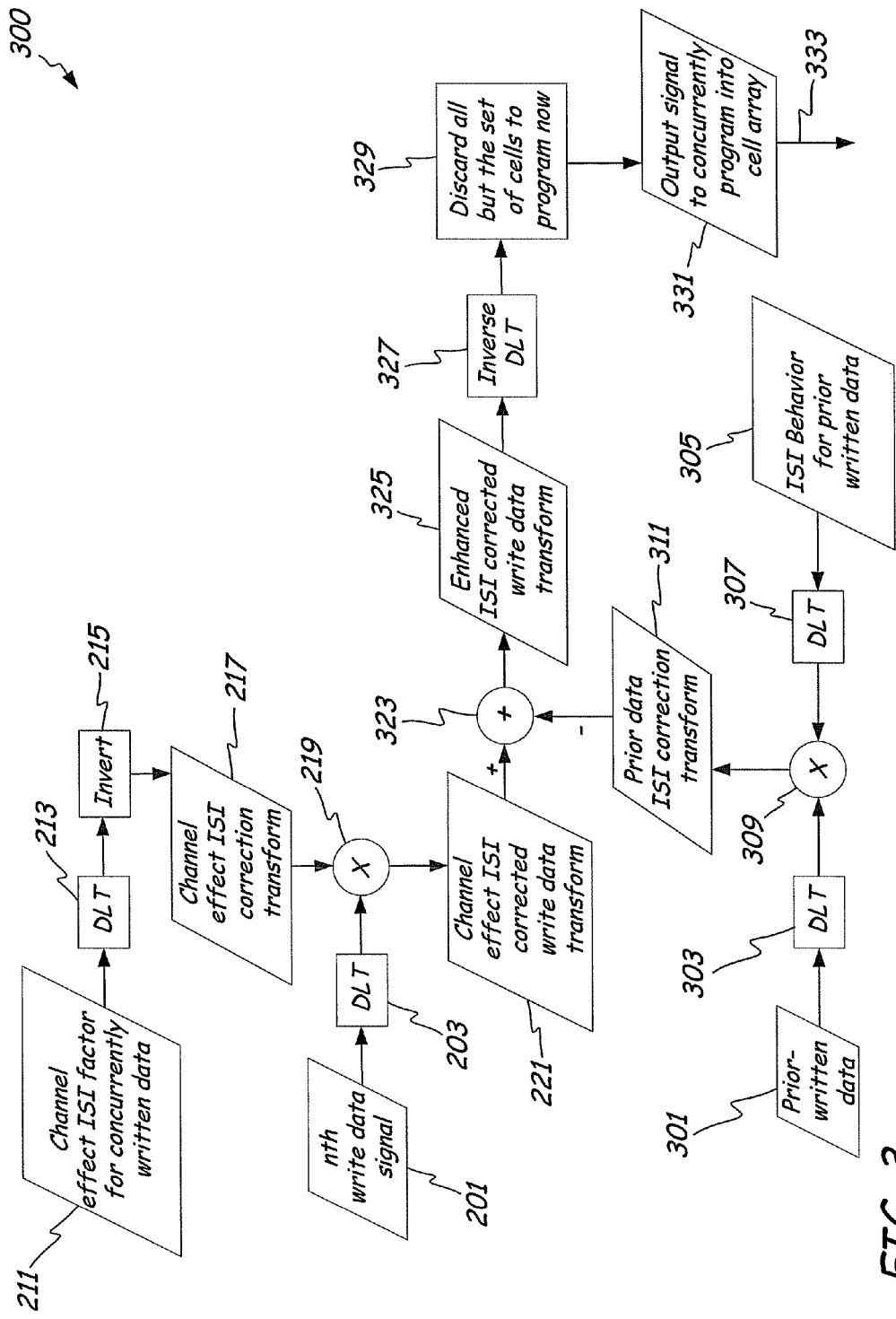
FIG. 3 depicts a block diagram for a method in accordance with another illustrative embodiment.

FIG. 3 depicts a block diagram for method 300 in accordance with another illustrative embodiment that combines concurrent intersymbol interference correction with intersymbol interference correction for previously written data. Method 300 includes various elements in common with method 200 of FIG. 2, including elements 201, 203, 211, 213, 215, 217, 219, and 221. Method 300 also includes taking prior-written data 301 and taking its discrete linear transform 303, and taking a calculation or model of the intersymbol interference behavior 305 for the prior-written data, and taking its discrete linear transform 307. The discrete linear transforms 303 and 307 may be combined in a multiplication operation 309, producing a prior data ISI correction transform 311, which in turn may be combined with channel effect ISI corrected write data transform 221 in a summation operation 323, in which the prior data ISI correction transform 311 is subtracted from the channel effect ISI corrected write data transform 221. The result is enhanced ISI corrected write data transform 325—enhanced in the sense that it is doubly ISI-corrected, both for the ISI of the previously written data and for the ISI of concurrently written data. Enhanced ISI corrected write data transform 325 may be subjected to an inverse discrete linear transform operation 327, a step 329 of discarding any values other than a set to be concurrently written, resulting in output signal 331 to concurrently program into a cell array, provided as the output 333 of the method 300.

In different embodiments, either the concurrent ISI correction and/or the prior-written-data ISI correction may be computed in one or more dimensions, as described above with reference to the concurrent ISI correction. In one illustrative embodiment, for example, only a single, one-dimensional row of data storage cells may be concurrently written at a time, while adjacent rows of data storage cells may already have been written to. In this case, the prior-written data and the ISI correction for the prior-written data may be considered in two dimensions, while the concurrently written data and the ISI correction for the concurrently written data may be considered in one dimension, but are still combined with the two-dimensional ISI correction factor for the prior-written data, to apply both ISI correction factors to the finally resulting write signal.

The channel effect concurrent ISI corrected write data transform may therefore be expanded from a one-dimensional 1*N vector and put into the form of an M*N matrix in which one row represents the original channel effect corrected data transform and all the remaining rows are zeroed, and the prior data intersymbol interference correction factor is provided in the form of an M*N matrix. After the matrix operations involved in providing the enhanced ISI correction write data transform, corrected both for prior and concurrent ISI, the data not needed for writing the one-dimensional row may be discarded, or the data for a target row may otherwise be isolated out isolating out as a particular subset of ISI-corrected data for a particular write operation. This may be done either prior to taking the inverse discrete linear transform thereof, such as by only selecting the one relevant row, or after taking the inverse transform. In either case, the method provides a resulting one-dimensional vector as the ultimate concurrent-ISI-corrected write signal output, to write to the target row of data storage cells, in this embodiment. In other cases in which more than one row are written at the same time, data may be combined and multiple rows may have both their prior-data and channel effect ISI corrections calculated together. This may be done iteratively so that a single ISI correction operation can be done on a relatively larger block of write data, and then the ISI-corrected block can be parceled out into a series of relatively smaller blocks of ISI-corrected write data to be sent in a series of discrete write operations to a data storage array, for example.

Figure 4:
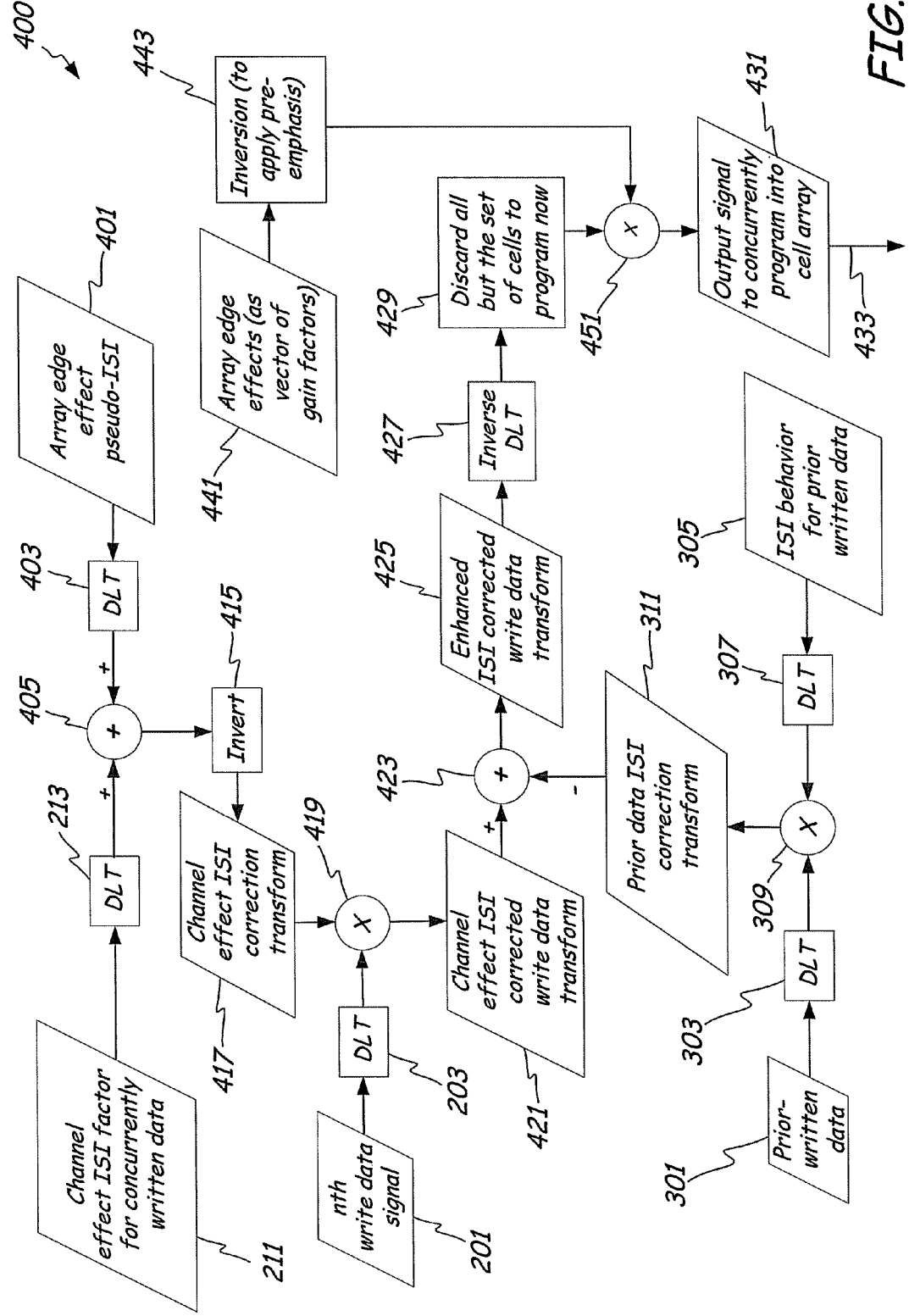
FIG. 4 depicts a block diagram for a method in accordance with another illustrative embodiment.

FIG. 4 depicts a block diagram for a method 400 in accordance with yet another illustrative embodiment. Method 400 provides a channel effect factor that also applies a correction factor that models a correction for the interference response of the concurrent intersymbol interference of the write data signal in the target data storage component due to physical array edge effects. The physical array edge effects are distinct from circular convolution edge effects that may already require correction by using a buffer of zeroes in the matrices encoding the ISI correction transforms, which may also be applied in various embodiments, and are due instead to interference from the physical edges or other discontinuities in the physical array of data storage cells.

These edge effects may be a special case of intersymbol interference or may be modeled as such despite not being limited to intersymbol interference from write operations to adjacent cells. For example, physical array edge effects may include distortions to the data write signal due to interference from the physical edges of a programming page or an erasure block in the physical array of data storage cells. However, these may be modeled as linear interference effects, and may even be modeled in some embodiments as "phantom" data cells that appear for example as inverted reflections of edge data cells in the array edges, due to inductance, capacitance, or other impedance-type effects in the physical edges around the data storage cell array. In this case, the interference from the edge effects may be modeled as linear intersymbol interference from the phantom data storage cells apparent in the array edges, and this linear or approximately linear "pseudo-ISI" may be calculated as an additional discrete and linear concurrent ISI channel effect.

As shown in FIG. 4, the array edge effect pseudo-ISI 401 may be subjected to a discrete linear transform 403, and combined with the transform 213 representing the channel effect ISI 211 in a summation operation 405. Elements 415 through 433 are then the same as the corresponding components of method 300 in FIG. 3, with the exception that they incorporate the calculation of the array edge effect pseudo-ISI 401 together with the channel effect ISI 211.

FIG. 4 also depicts an illustrative option, which may or may not be used in different embodiments, in which array edge effects 441 of concurrent ISI are represented as a vector of gain factors (while a matrix, above-one-dimensional tensor, or other representation may also be used in various embodiments). Method 400 may use the option based on array edge effects 441 represented as a vector of gain factors as an alternative to using array edge effect pseudo-ISI 401, in one illustrative embodiment. Method 400 may then include step 443 of inversion of the representation of the array edge effects 441, to apply as pre-emphasis to the write data. The representation of the inverted array edge effects may then be fed to a multiplication operation 451 with a given set of write data 429, which has already been through the prior, "standard" ISI correction process for within-block ISI, as represented by prior process elements of FIG. 4. The multiplication operation 451 may then provide corrected write data signal 431, of values to concurrently program into the cell array, that may be provided as output 433, in an illustrative embodiment.

FIG. 5 provides a simplified depiction of a data storage device 500 comprising programming controller 501 and data storage array 505, in accordance with another illustrative example. Input/output bus 503 may communicatively connect programming controller 501 and/or data storage array 505 to each other and/or to device interface 509, in various embodiments. In different embodiments, a wide variety of different communicative channel topologies, including on-chip, over a communication bus, and otherwise, may be used among the programming controller 501, the data storage array 505, device interface 509, and other components both within and outside data storage device 500. Any of these arrangements may allow programming controller 501 to receive write data signals, apply concurrent intersymbol interference correction conditioning to the write data signals, and output the resulting concurrent-intersymbol-interference-corrected write signals to write to the data storage array 505, in accordance with different embodiments.

Programming controller 501 may illustratively also perform additional tasks such as apply additional intersymbol-interference correction techniques to correct for circular convolution edge effects and/or physical array edge effects during a write operation, or apply additional intersymbol-interference correction to recorded data from the data storage array 505 during a read operation, as illustrative examples.

Data storage array 505 may include a plurality of data storage cells of any of various types, including flash memory, phase change memory, and other data storage technologies in different embodiments. Illustrative array section 511 of data storage cells is shown in a magnified internal view from within data storage array 505. The illustrative array section 511 of data storage cells is not represented to scale, and various embodiments of data storage systems may include any number, potentially up through the billions, trillions, or far more, of operably connected data storage cells. While data storage array 505 is depicted as a single integrated circuit in the illustrative example of FIG. 5, other embodiments of data storage systems may include any number of integrated circuits and/or other elements, within a single data storage device or among a number of networked or otherwise interconnected data storage devices, and may include a variety of different types of devices utilizing a number of different data storage technologies, distributed in a variety of different arrangements.

Illustrative array section 511 of data storage cells comprises a number of erasure blocks, while each of the erasure blocks comprises a number of programming pages, and each programming page comprises a number of data storage cells, in this illustrative embodiment. Illustrative array section 511 is an illustrative example of a small portion of the entirety of data storage array 505, which may contain up to a very large number of erasure blocks, programming pages, and data storage cells, and may also contain additional types of data storage besides the data storage cells as shown in illustrative array section 511. The data storage cells may also be either single-layer or multi-layer cells, and may each encode either a single bit per cell, or more than one bit per cell (including two bits per cell, one and a half bit per cell, three bits per cell, or otherwise), or more than one cell per bit (for example in the case of applications specialized for radiation-hardened uses), and may also encode either one symbol per bit or one symbol per more than one bits, for example, where the intersymbol interference correction encoding may take place among symbols mapped to single bits or to multiple bits.

FIG. 5 also depicts an illustrative individual erasure block 513 as an arbitrarily selected illustrative erasure block out of illustrative array section 511 of data storage array 505, in a second magnified view from within illustrative array section 511. Erasure block 513 is communicatively connected with bit line 521 and ground line 523, and is mostly surrounded by erasure block shielding 515. Erasure block 513 illustratively includes eight programming pages 517.0 through 517.7 (collectively referred to as 517.M), and each of the programming pages 517.M illustratively includes eight data storage cells 517.M.N, an arbitrarily selected illustrative few of which are illustratively labeled in FIG. 5, i.e. the fifth through eighth data storage cells of programming page 517.7, labeled as 517.7.4, 517.7.5, 517.7.6, and 517.7.7.

Each programming page may form a row or other topologically one-dimensional grouping (not necessarily confined to alignment along one physical dimension) of data storage cells arranged to be written to concurrently. For example, one programming page may have read and/or write signal connections only at two ends thereof, so that the entire programming page may be written to and/or read in one concurrent write and/or read operation, or the programming page may otherwise be arranged for bits or other signal elements to propagate concurrently in a queue between the two signal connections at the two ends of the programming page. The channel effect correction factor applied by the controller may compensate for intersymbol interference of the data being written to one of the programming pages during a write operation that concurrently writes to some or all of the data storage cells in that programming page.

Representative data storage cell 517.0.6 is shown in a third magnified view at the lower left of FIG. 5, and illustratively depicts a simplified larger view of the individual components of the data storage cells. Representative data storage cell 517.0.6 is depicted to include a bit gate 531 positioned proximate to a P substrate 533; a first N cell 535 and a second N cell 537 in the P substrate acting as a source and a drain, respectively, for that particular bit gate 531; and a word line control gate 539 positioned proximate to the bit gate 531. Representative data storage cell 517.0.6 thereby serves as a NAND flash data storage cell, in this illustrative embodiment. Additional elements, such as the signal lines for the word line control gates, may also be comprised in an illustrative embodiment, but are omitted from the depiction of FIG. 5 merely for the sake of simplification.

The example of eight data storage cells per programming page, eight programming pages per erasure block, and the communicative signal line structure of bit line 521 and ground line 523 with erasure block 513, are all illustrative examples that are chosen to provide an illustrative representation for the purposes of the example in FIG. 5, while those skilled in the relevant field of art will recognize that a wide variety of other particular arrangements of data storage cells, programming pages, signal lines, and erasure blocks may be used in other embodiments within the scope of the present disclosure, including any number N of data storage cells per programming page or other group of data storage cells, and any number M of programming pages or other groups of data storage cells per erasure block or other type of collection of groups of data storage cells, in an illustrative example. In this example, the M*N (i.e. M by N) data storage cells can be accurately or approximately characterized by a linear interference response, or can be made to be accurately or approximately characterized by a linear interference response by means of correction factors for any non-linear perturbation effects, such that both data written concurrently to the M*N data storage cells and the concurrent intersymbol interference behavior of the M*N data storage cells are susceptible of being manipulated using discrete linear transforms, illustratively such as fast Fourier transforms, or other linearity-assuming convolution techniques. A linear interference response is an accurate model for many embodiments of flash memory, for example, because voltages applied to neighboring data storage cells to store charge on those cells exert intersymbol interference that is linearly additive on a target data storage cell, in an illustrative embodiment.

Programming page 517.7 is also communicatively connected to bit line 521 via bit line select transistor 517.7.b, and communicatively connected to ground line select transistor 523 via ground line select transistor 517.7.g. Each of the additional programming pages 517.0 through 517.6 in erasure block 513 may also be similarly arranged, and each of the erasure blocks 513.x in data storage array 505 may also be similarly arranged, although there may also be various differences in details of structure or function among different programming pages, erasure blocks, or sections of the data storage array 505 to serve various purposes in different embodiments.

As discussed above, concurrent intersymbol interference may naturally and perhaps unavoidably take place among any of the data storage cells 517.M.N in erasure block 513, or more generally among any of the data storage cells 513.x.M.N in data storage array 505, and is more and more of a constraint on reliable data storage the smaller the data storage cells and other chip features are and the denser and closer together the data storage cells and other chip features are. Trying to separate the data storage cells through the combination of distance and shielding materials to minimize intersymbol interference has been a substantial constraint on data storage density and reliability, but various embodiments disclosed herein instead incorporate concurrent intersymbol interference in the encoding of the concurrent write operations to the data storage cells of the data storage array, thereby providing for an inherently more efficient, denser, and more reliable data storage technology than was previously possible.

A channel effect factor may include modeling of concurrent intersymbol interference of an nth portion of the write data signal in either a target programming page in a target data storage component, where the nth portion of the write data signal is assigned for writing in a single write operation to the target programming page, or in the write data signal in a plurality of programming pages in a target erasure block in a target data storage component, where the nth portion of the write data signal is assigned for writing in a substantially concurrent write operation to the target erasure block. This may include correction factors for particular environmental influences on any particular data storage cell in a particular programming page or erasure block, in addition to the ISI behavior of the surrounding data storage cells being concurrently written to. A write operation to a plurality of programming pages or erasure blocks may be substantially concurrent if they are performed within rapid succession and have an overlap in time, including if the effects of a write operation in one have not finished taking effect and are still in flux when the write operation in a different one has begun, for example.

The depiction of FIG. 5 is not intended to represent the particular dimensions, packaging, or parameters of a specific configuration of a data storage system, but rather to provide a simplified example, while a very wide variety of configurations and permutations of parameters will be perceived as implicit in the present depiction and description by those skilled in the relevant field of art.

In another illustrative embodiment, for example, a data storage device based on phase-change memory rather than flash memory may be used. For example, the individual data storage cells may each comprise a phase-change memory element such as an element of chalcogenide glass. Data write signal lines through the data storage array may include write signal lines that provide a heating mechanism in connection with each of the chalcogenide glass elements, that are thereby configured to alternate the chalcogenide glass between two or more states.

This may be done, for example, such as by applying either a relatively lower level of heat to a chalcogenide glass element such that the heat applied is sufficient to approximately fully crystallize the element, but not to melt it, thereby forcing that element into a crystalline state with a low electrical resistance, or by applying a relatively higher level of heat to the chalcogenide glass element such that the heat applied is sufficient to approximately fully melt the element, thereby forcing that element into an amorphous state with a high electrical resistance, while these differences in resistance may be read by electrical read lines. In this illustrative embodiment of phase change memory, as with the flash memory embodiment discussed above, a linear interference response may be an accurate model, because varying levels of heat applied to multiple neighboring data storage cells to change the physical state and therefore resistance of those cells exert intersymbol interference that is linearly additive on a target data storage cell, including for both prior and concurrent write operations, in an illustrative embodiment.

In still other embodiments based on phase change memory, multiple states besides only two may be susceptible of storage by each data storage cell. For example, a single data storage cell comprising a chalcogenide glass element may be susceptible of being controllably heated to any of four different temperatures that force the glass element into a fully crystalline state for the lowest of the four temperatures, a fully melted state for the highest of the four temperatures, or intermediately crystalline states for the two intermediate temperatures, all four states being controllably determined by heating-mechanism write signals and being reliably readable according to the four different levels of electrical resistance provided by the four different states.

This provides an illustrative example of encoding data in other than a 1:1 relation between bits and individual data storage cells, in this case encoding 2 bits per single data storage cell. Other numbers of states may also be used in each data storage cell in other embodiments, such as three states per cell, using only one intermediate crystalline/amorphous phase, in which data may be stored in three bits per two cells, for example. In a wide variety of such embodiments, the concurrent intersymbol interference among the data storage cells may still be accurately modeled as having a linear interference response, or as bring susceptible of linear modeling with manageable approximation factors, with the various heating levels and electrical resistance levels of each of the cells surrounding a particular target cell exerting linearly additive intersymbol interference on that target cell, in various illustrative embodiments.

The present disclosure therefore includes unexpected and novel advantages as detailed herein and as can be further appreciated from the claims, figures, and description by those skilled in the relevant art. Although some of the embodiments are described in reference to a data storage medium or a data storage system, the present disclosure encompasses various other embodiments with application to other data storage technologies and a wide variety of other types of devices. It is to be understood that even though numerous characteristics and advantages of various illustrative embodiments of the disclosure have been set forth in the foregoing description, together with details of the structure and function of various embodiments of the disclosure, this disclosure is illustrative only, and changes may be made in detail, especially in matters of structure and arrangement of parts within the principles of the present disclosure, to the full extent indicated by the broad, general meaning of the terms in which the appended claims are expressed. It will be appreciated by those skilled in the art that the teachings of the present disclosure can be applied to a family of systems, devices, and means encompassed by and equivalent to the examples of embodiments described, without departing from the scope and spirit of the present disclosure. Further, still other applications for various embodiments, including embodiments pertaining to data storage media and data storage systems, are comprised within the present disclosure.

What is claimed is:

1. A method comprising:
receiving a write data signal as input to a processing component;
producing a channel-effect-corrected encoding of the write data signal based on the write data signal and a channel effect factor that models concurrent intersymbol interference of concurrently written data in a target data storage component in communicative connection with the processing component; and
producing, from the processing component, an output signal based on the channel-effect-corrected encoding of the write data signal.

2. The method of claim 1 in which the target data storage component comprises one or more programming pages, and the channel effect factor models concurrent intersymbol interference of the write data signal being concurrently written to the one or more programming pages.

3. The method of claim 1 in which the target data storage component comprises one or more erasure blocks, and the channel effect factor models concurrent intersymbol interference of the write data signal being concurrently written to the one or more erasure blocks.

4. The method of claim 1, in which the channel effect factor models concurrent intersymbol interference of an nth portion of the write data signal in a target programming page in the target data storage component, where the nth portion of the write data signal is assigned for writing in a single write operation to the target programming page.

5. The method of claim 1, in which the channel effect factor models concurrent intersymbol interference of an nth portion of the write data signal in a plurality of programming pages in a target erasure block in the target data storage component, where the nth portion of the write data signal is assigned for writing in a substantially concurrent write operation to the target erasure block.

6. The method of claim 1, in which providing the channel-effect-corrected encoding of the write data signal comprises providing a discrete linear transform of the write data signal, providing a discrete linear transform of the channel effect factor, inverting the discrete linear transform of the channel effect factor to produce a channel effect correction transform, multiplying the discrete linear transform of the write data signal by the channel effect correction transform to produce a channel effect corrected write data transform, and providing an inverse linear transform of the channel effect corrected write data transform.

7. The method of claim 6, in which providing one or more of the discrete linear transforms comprises calculating a fast Fourier transform, and in which providing the inverse linear transform comprises calculating an inverse fast Fourier transform.

8. The method of claim 1, in which the channel effect factor comprises a model of a write signal attenuation specific to data storage cells comprised in one or more target programming pages in the target data storage component.

9. The method of claim 1, in which the channel effect factor comprises a write signal attenuation that is greater for data storage cells at ends of a target programming page than for data storage cells in an interior of the target programming page.

10. The method of claim 1, in which the channel effect factor comprises a write signal attenuation that is greater for data storage cells along edges of a target erasure block than for data storage cells in the interior of the target erasure block.

11. The method of claim 1, further comprising:
providing a physical edge effect factor that models physical edge effects in the target digital storage component as linear pseudo-intersymbol interference in physical edges of one or more of a target programming page and/or a target erasure block; and
combining the physical edge effect factor with the channel effect factor.

12. The method of claim 1, further comprising:
providing a prior data intersymbol interference correction factor that models intersymbol interference to the data signal based on data previously written to the target data storage component;
combining the channel-effect-corrected encoding of the write data signal with the prior data intersymbol interference correction factor into an enhanced intersymbol-interference-corrected encoding of the write data signal; and
producing the output signal based on the enhanced intersymbol-interference-corrected encoding of the write data signal.

13. The method of claim 12, further in which the channel effect factor is provided in the form of an M*N matrix in which all rows except one are zeroed, and the prior data intersymbol interference correction factor is provided in the form of an M*N matrix.

14. The method of claim 1, in which the channel effect factor further comprises a correction factor that models a correction for perturbations away from linearity in the intersymbol interference response of the concurrent intersymbol interference of the write data signal in the target data storage component.

15. The method of claim 1, further comprising incorporating a gain control component that compensates for write signal response constraints to the channel-effect-corrected encoding of the write data signal in the data storage cells.

16. A controller comprising:
a processor; and
one or more input/output channels communicatively connected to the processor;
in which the controller is operatively configured to receive a write data signal, provide a channel effect factor that models concurrent intersymbol interference of concurrently written data in a target data storage component, provide a channel-effect-corrected encoding of the write data signal based on the write data signal and the channel effect factor, and provide an output signal based on the channel-effect-corrected encoding of the write data signal.

17. A data storage device comprising:
a programming controller;
a data storage array, in communicative connection with the programming controller, the data storage array comprising a plurality of programming pages that have a linear intersymbol interference response for data write operations; and
a channel, in communicative connection between the programming controller and the data storage array;
in which the programming controller is configured to:
provide a discrete linear transform of write data received for writing to the data storage array, and an inverted discrete linear transform of an intersymbol interference factor of the write data being concurrently written to a target programming page in the data storage array;
multiply the discrete linear transform of the write data and the inverted discrete linear transform of the intersymbol interference factor, and provide the result as a concurrent-intersymbol-interference-corrected write data transform;
provide a concurrent-intersymbol-interference-corrected write data signal comprising an inverse discrete linear transform of the concurrent-intersymbol-interference-corrected write data transform; and
write the concurrent-intersymbol-interference-corrected write data signal to the target programming page.

18. The data storage device of claim 17, in which the programming pages comprise flash data storage cells.

19. The data storage device of claim 17, in which the programming pages comprise phase-change memory data storage cells.

20. The controller of claim 16, further comprising a gain control component that compensates for write signal response constraints to the channel-effect-corrected encoding of the write data signal in the target data storage component.

* * * * *